(12) United States Patent
Lee et al.

(10) Patent No.: US 6,545,920 B2
(45) Date of Patent: Apr. 8, 2003

(54) DEFECTIVE ADDRESS STORAGE SCHEME FOR MEMORY DEVICE

(75) Inventors: Byeong-Hoon Lee, Seoul (KR); Young-Ho Lim, Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/967,102

(22) Filed: Sep. 28, 2001

(65) Prior Publication Data
US 2002/0060935 A1 May 23, 2002

(30) Foreign Application Priority Data
Nov. 22, 2000 (KR) .......................................... 2000-69533

(51) Int. Cl.$^7$ ................................................. G11C 7/00
(52) U.S. Cl. ..................... 365/200; 365/225.7
(58) Field of Search ............................. 365/200, 225.7, 365/96, 203, 230.03

(56) References Cited

U.S. PATENT DOCUMENTS

| | | | | |
|---|---|---|---|---|
| 5,258,947 A | * | 11/1993 | Sourgen | ........................ 365/96 |
| 5,258,953 A | | 11/1993 | Tsujimoto | |
| 5,657,280 A | | 8/1997 | Shin et al. | |
| 5,723,999 A | | 3/1998 | Merritt | |
| 5,822,257 A | * | 10/1998 | Ogawa | ........................ 365/200 |
| 5,995,422 A | * | 11/1999 | Im et al. | ........................ 365/200 |

* cited by examiner

Primary Examiner—David Nelms
Assistant Examiner—Gene N. Auduong
(74) Attorney, Agent, or Firm—Marger Johnson & McCollom PC

(57) ABSTRACT

A defective address storage circuit reduces current consumption in a memory device by utilizing a fuse block having address storage blocks arranged in series. Each address storage block preferably has two portions, each portion having a fuse and transistor. A NAND-type architecture can be implemented by arranging the portions of each block in parallel while the fuse and transistor are arranged in series, or by arranging the portions of each block in series while the fuse and transistor are arranged in parallel.

13 Claims, 7 Drawing Sheets

DEFECTIVE ADDRESS STORAGE SCHEME FOR MEMORY DEVICE

This application claims priority from Korean patent application No. 2000-69533 filed Nov. 22, 2000 which is incorporated by reference.

BACKGROUND OF THE INVENTION

1. Field of the Invention

The present invention relates generally to semiconductor memory devices, and more particularly to a scheme for storing an address of a defective memory cell.

2. Description of the Related Art

For many integrated circuit memory arrays, several redundant rows or columns are provided to be used as substitutes for defective rows or columns of main memory cells. When a defective row or column is identified, rather than treating the entire chip as defective, a redundant row or column can be employed instead of the defective row or column. The redundant row or column corresponding to the defective row or column is assigned for replacing the defective row or column. Then, when an address corresponding to the defective row or column is provided, the redundant row or column is accessed instead.

For the purpose of replacing the defective row or column with the redundant row or column, the memory device includes a defective address storage circuit (or, defective address detection circuit). The defective address storage circuit monitors row/column addresses and enables the redundant row or column in place of the defect row or column when the defective row or column address is provided. Some defective address storage circuits are disclosed in U.S. Pat. No. 5,258,953 entitled "Semiconductor Memory Device", U.S. Pat. No. 5,657,280 entitled "Defective Cell Repairing Circuit and Method of Semiconductor Memory Device", and U.S. Pat. No. 5,723,999 entitled "Redundant Row Fuse Bank Circuit".

FIG. 1 is a circuit diagram showing a prior art defective address storage circuit. The circuit of FIG. 1 includes a fuse 11, P-channel metal oxide semiconductor (MOS) transistor 12, inverter 13, and NOR-type fuse bank (or, NOR-type fuse array) 30. The fuse 11 and the PMOS transistor 12 are connected between a power supply voltage and a node N0, and the PMOS transistor 12 is switched on/off in response to a signal nRchk. An input terminal of the inverter 13 is connected to node N0, and an output terminal thereof provides a signal nRcen. The NOR-type fuse bank 30 includes fuses 14 through 24, and N-channel MOS transistors 15~25 which correspond to fuses 14 through 24, respectively. As shown in FIG. 1, the fuses 14~24 and the NMOS transistors 15~25 are arranged in a NOR architecture.

If no defective cells are identified, fuse 11 is blown and fuses 14~24 of the fuse bank 30 remain connected. In this state, at least one of the NMOS transistors 15~25 is turned on regardless of the combination of address signals A0, nA0, A1, nA1, A2, and nA2 provided, so the signal at node N0 remains low.

If, however, a defective row or column is identified, fuse 11 is left in the connected state, and fuses 14~24 of the fuse bank 30 are selectively cut to detect the address corresponding to the defective row or column. For example, if the address of a defective row or column is indicated by address signals A0~A2 being low, then fuses 14, 18, and 22 are left connected, while fuses 16, 20, and 24 are cut. Thus, when address signals A0~A2 are low (and address signals nA0~nA2 are high), node N0 is charged to the high level through fuse 11 and PMOS transistor 12 because all current paths from node N0 to ground are cut off. The signal nRcen is driven low by the inverter 13, which indicates that the row or column of the current address has a defect.

The signal nRcen causes the defective row or column to be replaced with the corresponding redundant row or column. When address signals corresponding to a normal row or column are provided, at least one of the address signals A0~A2 is high, so the NMOS transistor corresponding thereto is turned on. Thus, a current path is created from node N0 to the ground voltage terminal. Since the current drive capability of the PMOS transistor 12 is set lower than that of the NMOS transistors of the fuse bank 30, the node N0 is maintained at the low level, thereby causing the signal nRcen to go high.

Memory devices typically include multiple defective address storage circuits. As described above, each of the defective address storage circuits creates a direct current path from the power supply voltage to the ground voltage when the address provided from the outside is not identical with the stored address of the defective address storage circuit. This results in unnecessary current consumption.

SUMMARY OF THE INVENTION

The present invention involves the use of address storage blocks coupled in series to reduce current consumption in a defective address storage circuit for a semiconductor memory device.

One aspect of the present invention is a defective address storage circuit for a semiconductor memory device having redundant cells for replacing defective memory cells, the circuit comprising: a precharge circuit coupled between a first voltage terminal and an output node and adapted to precharge the output node to a potential of the first voltage terminal in response to a control signal; and a fuse bank coupled between the output node and a second voltage terminal and adapted to store address signals corresponding to a defective memory cell; wherein the fuse bank comprises address storage blocks coupled in series between the output node and the second voltage terminal.

Another aspect of the present invention is a defective address storage circuit for a semiconductor memory device comprising a plurality of address storage blocks coupled in series.

A further aspect of the present invention is a defective address storage circuit for a semiconductor memory device comprising: means for precharging an output node; and a plurality of means for storing a defective address coupled in series with the output node.

DETAILED DESCRIPTION

The following detailed description is of the preferred embodiments presently contemplated by the inventors for practicing the invention. It should be understood that the description of these preferred embodiments is merely illustrative and that they should not be taken in a limiting sense.

Figure 1:
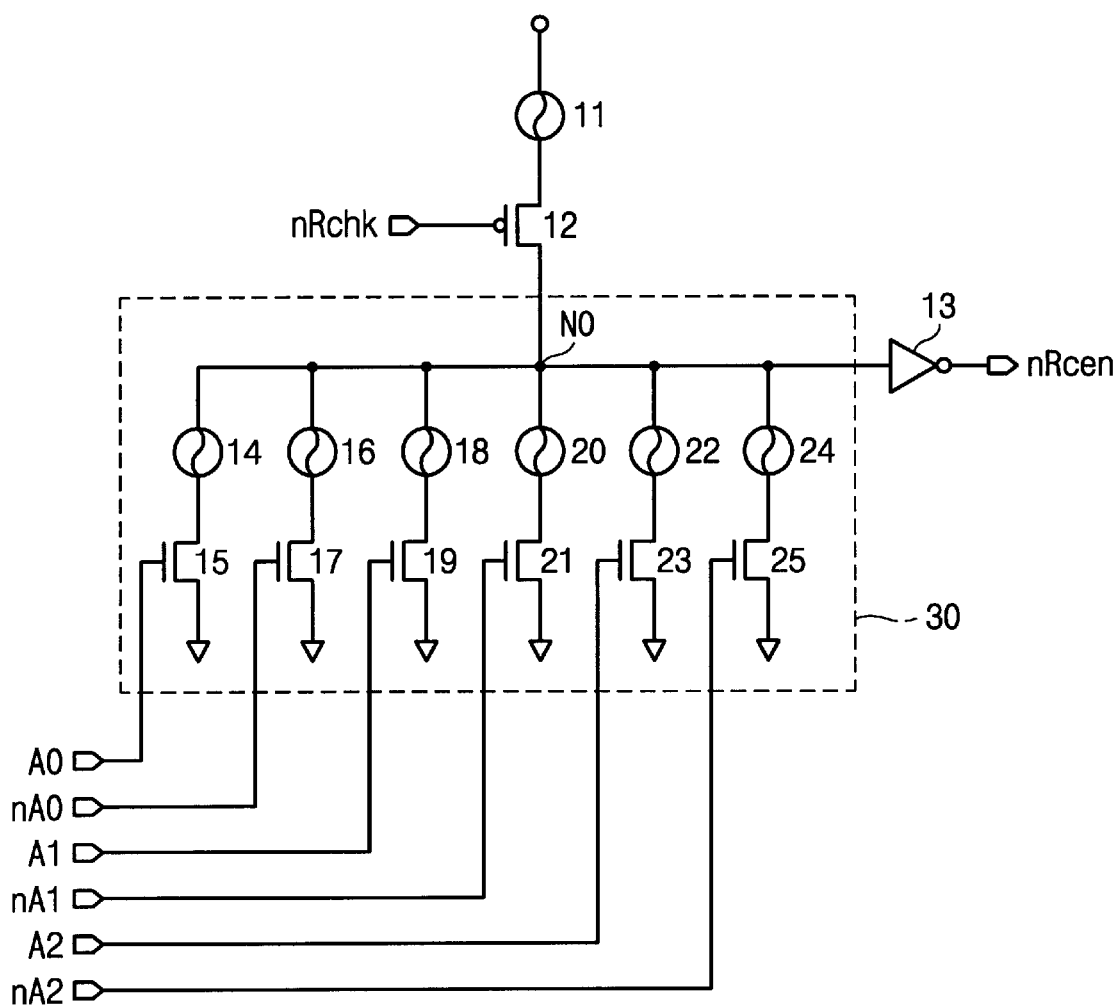
FIG. 1 is a circuit diagram of a prior art defective address storage circuit.
Figure 2:
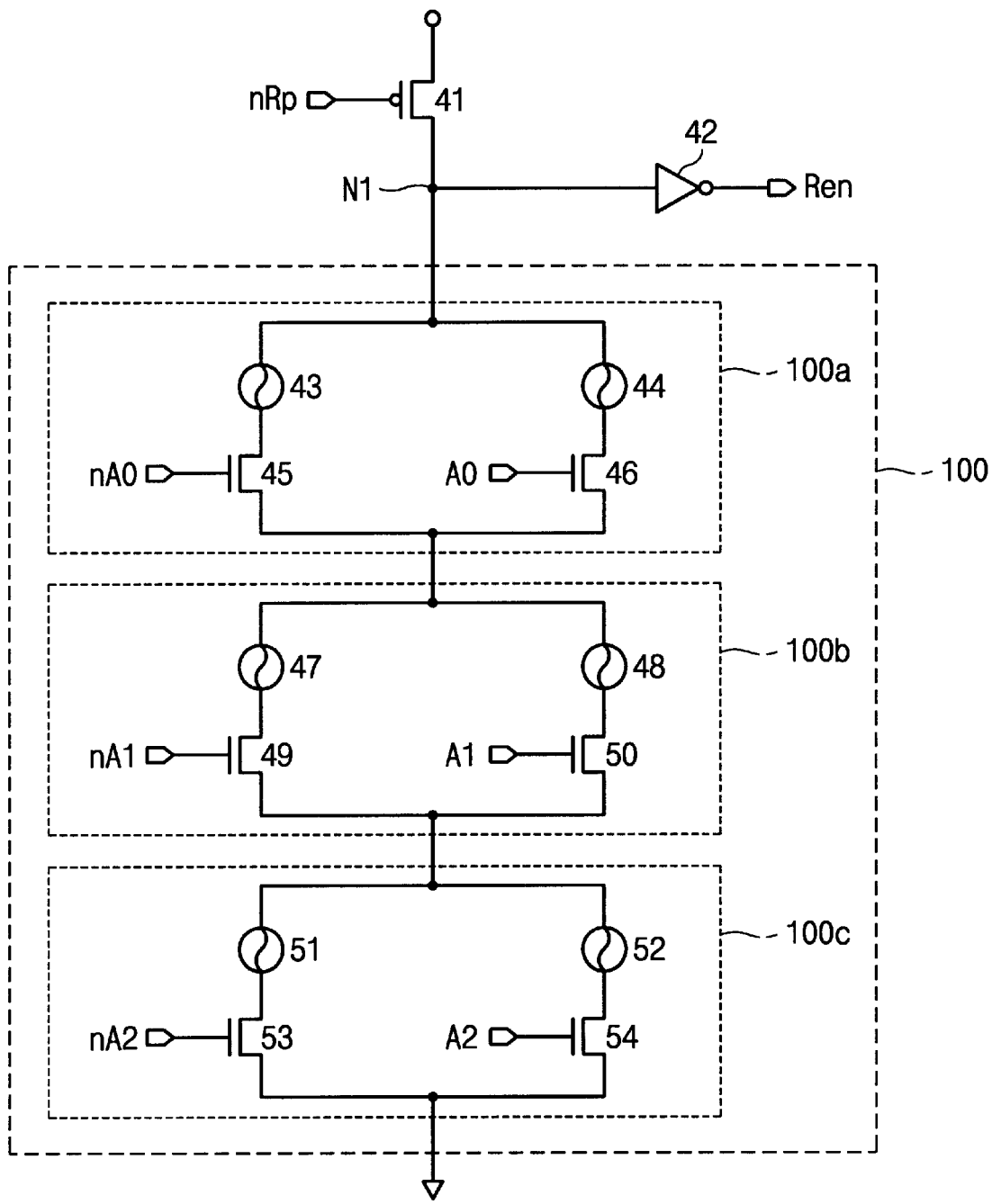
FIG. 2 is a circuit diagram of a first embodiment of a defective address storage circuit in accordance with the present invention.

FIG. 2 is a circuit diagram showing an embodiment of a defective address storage circuit for a semiconductor memory device according in accordance with the present invention. Referring to FIG. 2, the defective address storage circuit includes P-channel metal oxide semiconductor (MOS) transistor 41, inverter 42, and NAND-type fuse bank 100. The PMOS transistor 41 is connected between a power supply voltage terminal and output node N1, and precharges node N1 to the power supply voltage level in response to control signal nRp. The inverter 42 is connected to node N1, and generates the signal Ren in response to the potential of node N1. The PMOS transistor 41 serves as a precharge circuit, and the inverter 42 serves as a buffer circuit.

Continuing to refer to FIG. 2, the NAND-type fuse bank 100 includes a plurality of address storage blocks 100a, 100b, and 100c which are connected in series between node N1 and a ground voltage terminal in a NAND-type architecture. Each of the address storage b locks 100a, 100b, and 100c is formed of two fuses and two N-channel MOS transistors. The fuse 43 and the NMOS transistor 45 of the address storage block 100a are connected in series between the node N1 and the address storage block 100b. The fuse 44 and NMOS transistor 46 are connected in series between the node N1 and the address storage block 100b. Thus, fuse 43 and NMOS transistor 45 form a portion of the address storage block 100a that is connected in parallel with another portion formed by the fuse 44 and the NMOS transistor 46. The NMOS transistors 45 and 46 are connected to receive complementary address signals nA0 and A0, respectively. Likewise, the rest of the address storage blocks 100b, and 100c have the same circuit arrangement as the address storage block 100a, so that the descriptions thereof are omitted to avoid redundancy.

Figure 3:
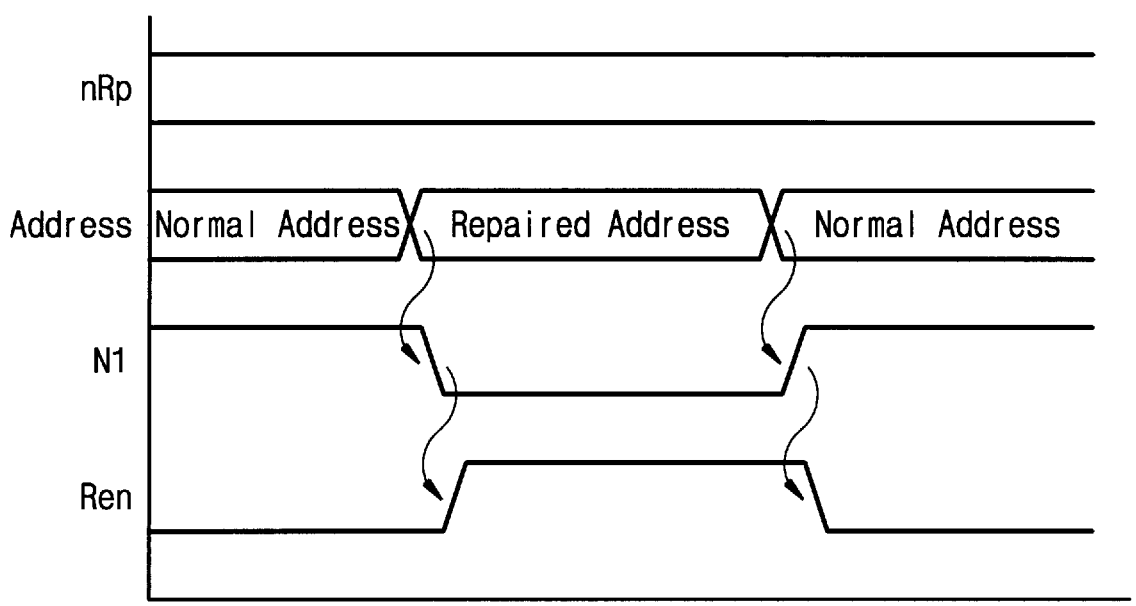
FIG. 3 is a timing diagram illustrating the operation of the defective address storage circuit shown in FIG. 2.

FIG. 3 is a timing diagram showing an operation of the defective address storage circuit of FIG. 2. Assuming that an address corresponding to a defective cell (referred to as a "repair address" hereinafter), e.g., A0~A2, is "000", the repair address is stored in the defective address storage circuit shown in FIG. 2. In that case, the fuses 44, 48 and 52 corresponding to the repair address signals A0~A2 are cut, while the fuses 43, 47, and 51 corresponding to complementary repair address signals nA0~nA2 remain connected. In this manner, the repair address is stored in the fuse bank 100.

When the signal nRp goes low, the output node N1 goes high through the PMOS transistor 41. As shown in FIG. 3, when the repair address A0~A2 of "000" is provided, the NMOS transistors 46, 50, and 54 are turned off, while the NMOS transistors 45, 49, and 53 are turned on in response to the complementary address signals nA~nA2 of "111". Thus, a current path between the node N1 and the ground voltage terminal is formed through 43, 45, 47, 49, 51, and 53 in order, so node N1 is pulled low, and the signal Ren goes high to access a redundant cell in place of the defective cell.

If a normal address, for example "010", is provided to the defective address storage circuit shown in FIG. 2, the NMOS transistor 50 of the address storage block 100b in the NAND-type fuse bank 100 is turned on, while the NMOS transistor 49 is turned off. Thus, there is no current path through the address storage blocks 100a, 100b and 100c to the ground voltage terminal, so no current is consumed by the fuse bank 100 when a normal address is provided.

Figure 4:
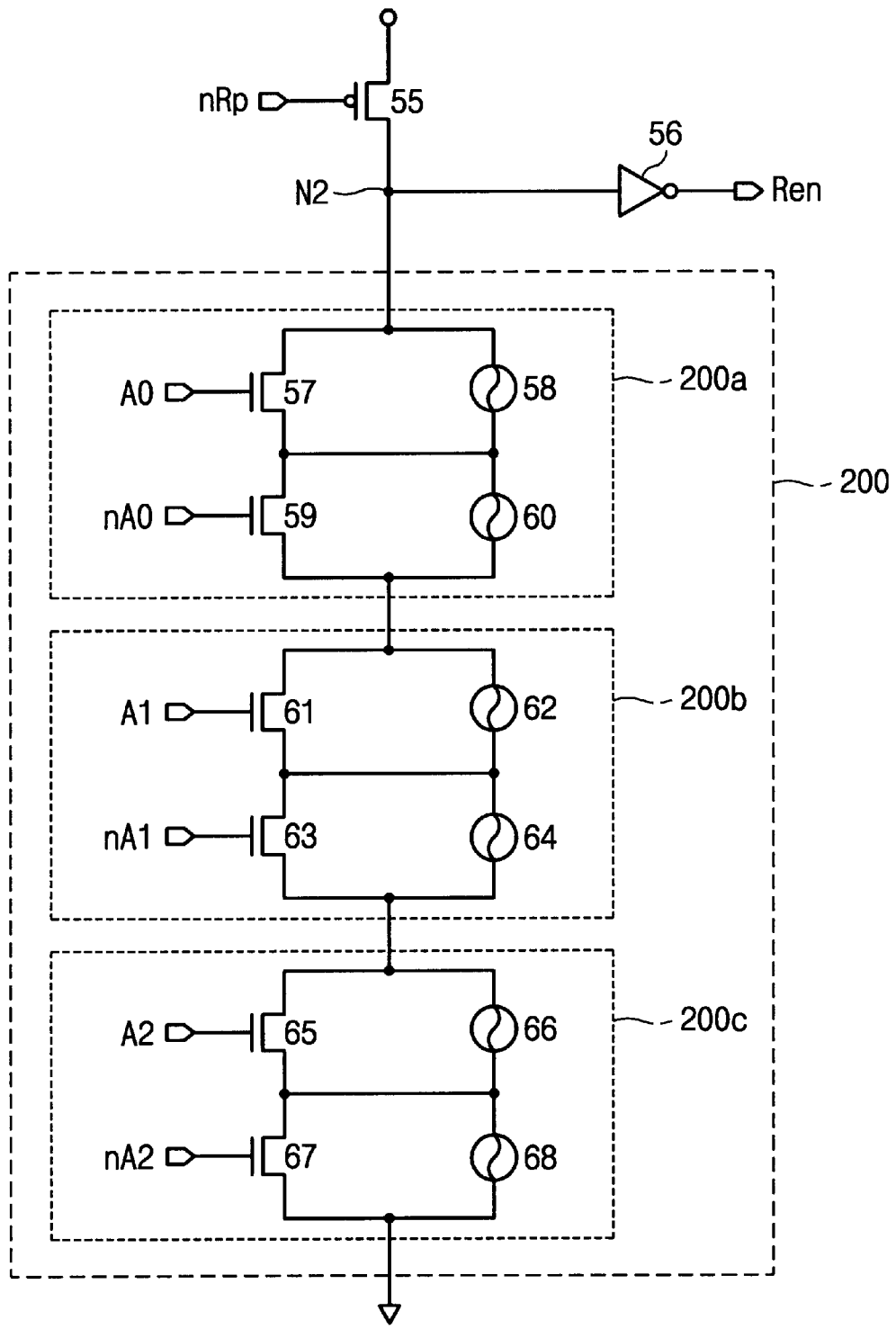
FIG. 4 is a circuit diagram of a second embodiment of a defective address storage circuit in accordance with the present invention.

FIG. 4 is circuit diagram of a second embodiment of a defective address storage circuit in accordance with the present invention. Referring to FIG. 4, the defective address storage circuit includes PMOS transistor 55, inverter 56, and NAND-type fuse bank 200. The PMOS transistor 55 is connected between the power supply voltage terminal and output node N2, and precharges node N2 to the power supply voltage in response to control signal nRp. The inverter 56 is connected to the node N2, and generates the signal Ren in response to the potential of the node N2. The PMOS transistor 55 serves as a precharge circuit, and the inverter 56 serves as a buffer circuit.

The NAND-type fuse bank 200 includes a plurality of address storage blocks 200a, 200b, and 200c which are connected in series between the output node N2 and the ground voltage terminal in a NAND-type architecture. Each of the address storage blocks 200a, 200b, and 200c is formed of two fuses and two NMOS transistors. The fuses 58 and 60 of the address storage block 200a are connected in series between the node N2 and the address storage block 200b. The NMOS transistors 57 and 59 are also connected in series between the node N2 and the address storage block 200b in series. A node between the fuses 58 and 60 is electrically connected to a node between the transistors 57, and 59. Thus, transistor 57 and fuse 58 form a first portion of the address storage block 200a which is in series with a second portion formed from transistor 59 and fuse 60. The NMOS transistors 57 and 59 of the address storage block 200a are connected to complementary address signals A0 and nA0, respectively. Likewise, the rest of the address storage blocks 200b and 200c have the same constitution as the address storage block 200a, as shown in FIG. 4.

If the repair address A0~A2, is "000", the repair address is stored in the NAND-type fuse bank 200 by cutting fuses 60, 64, and 68, while leaving fuses 58, 62, and 66 connected. When the repair address A0~A2 of "000" is provided, the NMOS transistors 57, 61, and 65 are turned off, while the NMOS transistors 59, 63, and 67 are turned on in response to the complementary repair address signals nA0~nA2. This forms a current path through 58, 59, 62, 63, 66, and 67 between the node N2 and the ground voltage terminal, so node N2 is pulled low, and the signal Ren goes high to access a redundant cell in place of the defective cell.

The output node N2 is precharged through the PMOS transistor 55 when the signal nRp is low.

If the normal address of "010" is provided to the defective address storage circuit of FIG. 4, the NMOS transistor 61 of the address storage block 200b is turned on, while the NMOS transistor 63 is turned off. Since the current path between the address storage blocks 100a and 100c is shut off, no current path is formed between the power supply voltage terminal and the ground voltage terminal. Therefore, no current is consumed by the defective address storage circuit of FIG. 4 when a normal address is provided.

Figure 5:
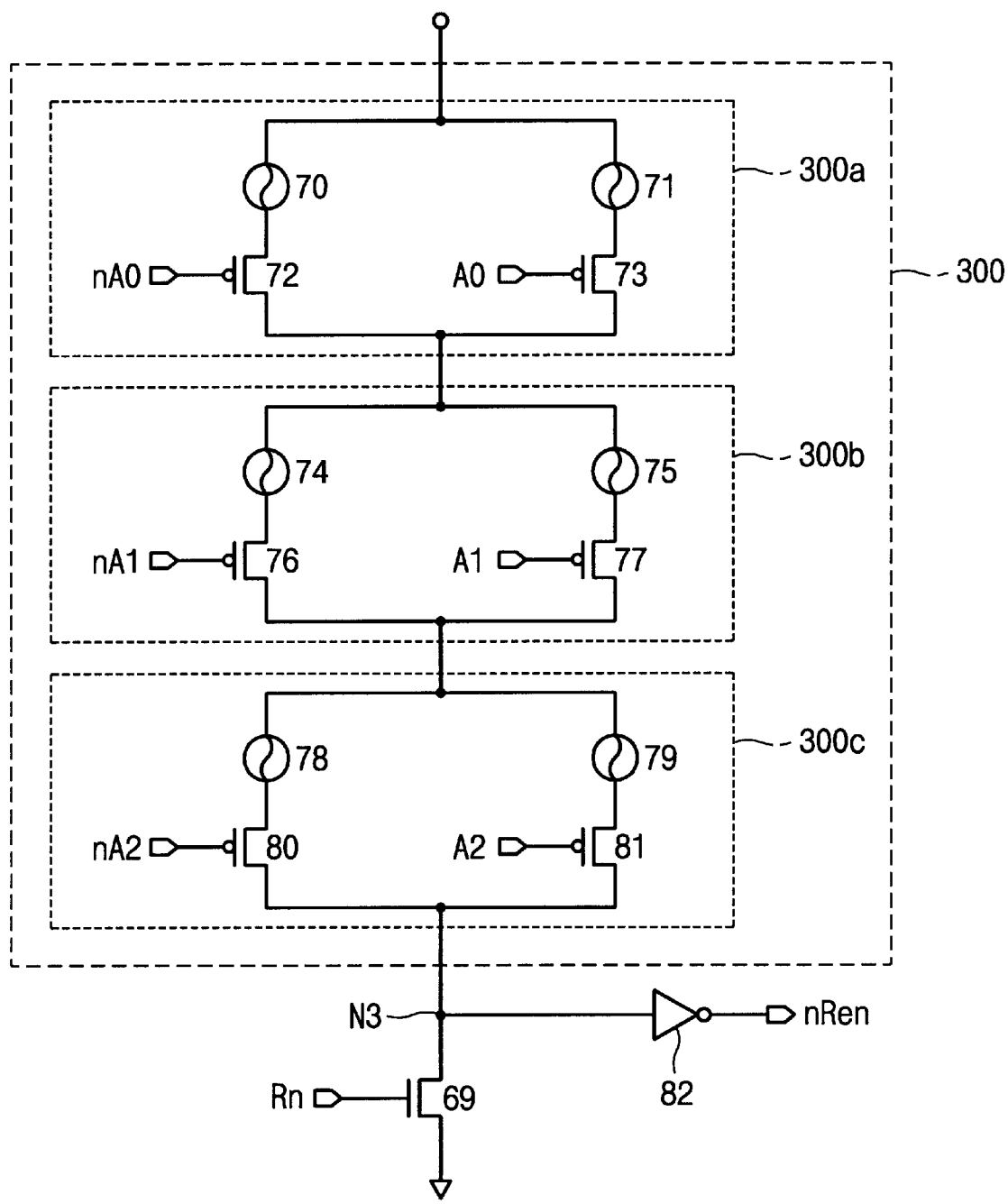
FIG. 5 is a circuit diagram of a third embodiment of a defective address storage circuit in accordance with the present invention.

FIG. 5 is a circuit diagram of a third embodiment of a defective address storage circuit according to the present invention. Referring to FIG. 5, the defective address storage circuit includes NMOS transistor 69, inverter 82, and NAND-type fuse bank 300. The NMOS transistor 69 is connected between the ground voltage terminal and an output node N3, and controlled by a control signal Rn to precharge the node N3 to the ground voltage. The inverter 82 has an input connected to the node N3, and generates the signals Rn in response to the potential of the node N3. The NMOS transistor 69 serves as a precharge circuit, and the inverter 82 serves as a buffer circuit.

Continuing to refer to FIG. 5, the NAND-type fuse bank 300 includes a plurality of address storage blocks 300a, 300b and 300c which are connected in series between the power supply voltage terminal and the node N3 in a NAND-type architecture. Each of the address storage blocks 300a, 300b, and 300c is formed from two fuses and two PMOS transistors.

The fuse 70 and the PMOS transistor 72 of the address storage block 300a are connected in series between the power supply voltage terminal and the address storage block 300b. The fuse 71 and the PMOS transistor 73 are connected in series between the power supply voltage terminal and the address storage block 300b. In other words, the fuse 70 and the PMOS transistor 72 form a portion of the address storage block 300a which is connected in parallel with another portion of the address storage block that includes the fuse 71 and the PMOS transistor 73. The PMOS transistors 72 and 73 are connected to the complementary address signals nA0 and A0, respectively. Likewise, the rest of the address storage blocks 300b and 300c have the same construction as the address storage block 100a, as shown in FIG. 5.

Figure 6:
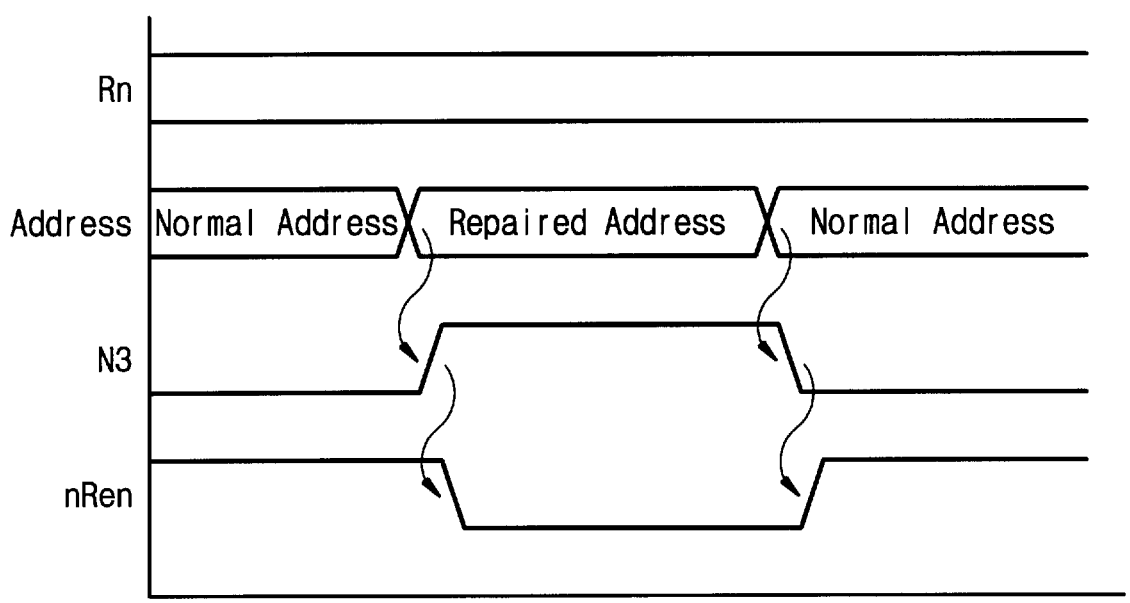
FIG. 6 is a timing diagram illustrating the operation of the defective address storage circuit shown in FIG. 5.

FIG. 6 is a timing diagram showing an operation of the defective address storage circuit shown in FIG. 5. Assuming that the repair address is "000", the repair address A0~A2 is stored in the defective address storage circuit shown in FIG. 5 by retaining fuses 71, 75 and 79 in the connected state, and cutting fuses 70, 74, and 78. In this manner, the repair address is stored in the NAND-type fuse bank 300.

When the signal Rn is high, node N3 is precharged to the low level through the NMOS transistor 69. As shown in FIG. 6, when the repair address A0~A2 of "000" is provided, the PMOS transistors 73, 77, and 81 are turned on, while the PMOS transistors 72, 76, and 80 are turned off in response to the complementary address signals nA0~nA2 of "111". Thus, a current path is formed through 71, 73, 75, 77, 79, and 81 between the power supply voltage terminal and the output node N3. Thus, the signal nRen goes low to access a redundant cell in place of the defective cell.

If the normal address of "010" is provided to the defective address storage circuit shown in FIG. 5, the PMOS transistor 77 of the address storage block 300b is turned off, while the PMOS transistor 76 is turned on. Thus, there is no current path between the power supply voltage terminal and the ground voltage terminal through the address storage blocks 300a and 300c, so no current is consumed by the circuit.

Figure 7:
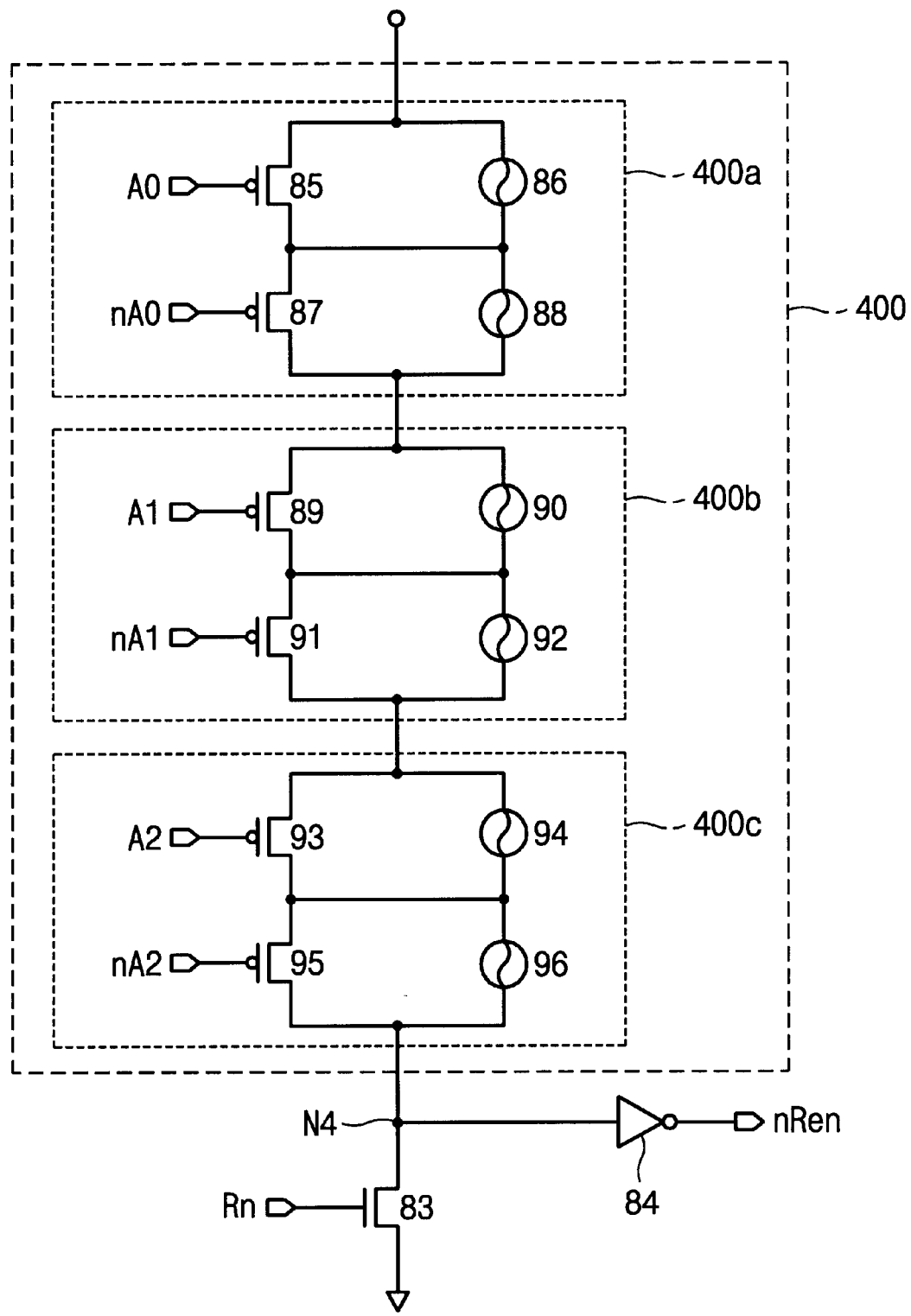
FIG. 7 is a circuit diagram of a fourth embodiment of a defective address storage circuit in accordance with the present invention.

FIG. 7 is circuit diagram of a fourth embodiment of a defective address storage circuit in accordance with the present invention. Referring to FIG. 7, the defective address storage circuit includes NMOS transistor 83, inverter 84, and NAND-type fuse bank 400. The NMOS transistor 83 is connected between an output node N4 and the ground voltage terminal, and controlled by the control signal Rn to precharge the node N4 to the ground voltage. The inverter 84 is connected to the node N4, and generates the signal nRen in response to the potential of the node N4. The NMOS transistor 83 serves as a precharge circuit, and the inverter 84 serves as a buffer circuit.

The NAND-type fuse bank 400 includes a plurality of address storage blocks 400a, 400b and 400c which are connected in series between the power supply voltage terminal and the node N4 in a NAND architecture. Each of the address storage blocks 400a, 400b, and 400c is formed of two fuses and two PMOS transistors. The fuses 86 and 88 of the address storage block 400a are connected in series between the power supply voltage terminal and the address storage block 400b. The PMOS transistors 85 and 87 of the address storage block 400a are connected in series between the power supply voltage and the address storage block 400b. A node between the transistors 85, and 87 is electrically connected to a node between the fuses 86, and 88. Thus, transistor 85 and fuse 86 form a first portion of the address storage block 200a which is in series with a second portion formed from transistor 87 and fuse 88. The PMOS transistors 85 and 87 are connected to the complementary address signals A0 and nA0, respectively. Likewise, the rest of the address storage blocks 400b and 400c have the same construction as the address storage block 400a.

Assuming that the repair address is "000", the fuses 86, 90, and 94 are cut, while the fuses 88, 92, and 96 remain connected. In this manner, the repair address is stored in the NAND-type fuse bank 400. When the signal Rn is high, the node N4 is precharged to the low level through the NMOS transistor 83. When the repair address A0~A2 of "000" is provided, the PMOS transistors 85, 89, and 93 are turned on, while the PMOS transistors 87, 91, and 95 are turned off in response to the complementary repair address signals nA0~nA2 of "111". Thus, a current path is formed through 85, 88, 89, 92, 93, and 96 between the power supply voltage terminal and the node N4. This causes the signal nRen to go low to access a redundant cell in place of the defective cell.

If the normal address of "010" is provided, the PMOS transistor 89 of the address storage block 400b is turned off, while the PMOS transistor 91 is turned on. Thus, there is no current path between power supply voltage terminal and the ground voltage terminal through the address storage blocks 400a and 400c, so no current is consumed by the circuit.

An advantage of the present invention is that there is no current path through the address storage blocks when a normal address is provided. This eliminates unnecessary power consumption.

Having described and illustrated the principles of the invention in a preferred embodiment thereof, it should be apparent that the invention can be modified in arrangement and detail without departing from such principles. Accordingly, such changes and modifications are considered to fall within the scope of the following claims.

What is claimed is:

1. A defective address storage circuit for a semiconductor memory device having redundant cells for replacing defective memory cells, the circuit comprising:

a precharge circuit coupled between a first voltage terminal and an output node and adapted to precharge the output node to a potential of the first voltage terminal in response to a control signal; and a fuse bank coupled between the output node and a second voltage terminal and adapted to store address signals corresponding to a defective memory cell;

wherein the fuse bank comprises address storage blocks coupled in series between the output node and the second voltage terminal.

2. The circuit of claim 1, wherein the fuse bank is constructed with a NAND-type architecture.

3. The circuit of claim 1, wherein each of the address storage blocks comprises two portions coupled in parallel, each of the portions comprising a fuse and a transistor coupled in series.

4. The circuit of the claim 3, wherein the transistors in the two portions of each address storage block are controlled by complementary address signals.

5. The circuit of claim 1, wherein each of the address storage blocks comprises two portions coupled in series, each of the portions comprising a fuse and a transistor coupled in parallel.

6. The circuit of claim 5, wherein the transistors in the two portions of each address storage block are controlled by complementary address signals.

7. The circuit of claim 1, wherein the first voltage terminal receives a power supply voltage, and the second voltage terminal receives a ground voltage.

8. The circuit of claim 1, wherein the first voltage terminal receives a ground voltage, and the second voltage terminal receives a power supply voltage.

9. The circuit of claim 1 further comprising a buffer circuit coupled to the output node.

10. A defective address storage circuit for a semiconductor memory device comprising a plurality of address storage blocks coupled in series, wherein each of the address storage blocks comprises two portions coupled in series.

11. A circuit according to claim 10 wherein each of the portions comprises a fuse and a transistor coupled in parallel.

12. A circuit according to claim 10 further comprising a precharge circuit coupled to one of the address storage blocks.

13. A defective address storage circuit for a semiconductor memory device comprising:

means for precharging an output node; and a plurality of means for storing a defective address coupled in series with the output node, wherein each of the means for storing a defective address comprises two portions coupled in series, each portion comprising a fuse and a transistor coupled in parallel.

* * * * *